United States Patent
Noguchi et al.

[11] Patent Number: 5,164,596
[45] Date of Patent: Nov. 17, 1992

[54] FOCUSED ION BEAM IRRADIATING APPARATUS

[75] Inventors: Shigeru Noguchi; Yasushi Kawai, both of Tokyo, Japan

[73] Assignee: Dai Nippon Printing, Tokyo, Japan

[21] Appl. No.: 848,031

[22] Filed: Mar. 9, 1992

[30] Foreign Application Priority Data

Mar. 28, 1991 [JP] Japan .................. 3-89569

[51] Int. Cl.$^5$ .......................................... H01J 37/317
[52] U.S. Cl. ................................ 250/309; 250/251; 250/397; 250/492.2; 250/492.3
[58] Field of Search ............... 250/309, 306, 307, 251, 250/492.2 R, 492.21, 492.3, 397

[56] References Cited

U.S. PATENT DOCUMENTS

| | | | |
|---|---|---|---|
| 4,639,301 | 1/1987 | Doherty et al. | 250/492.21 |
| 4,675,530 | 6/1987 | Rose et al. | 250/492.21 |
| 4,874,947 | 10/1989 | Ward et al. | 250/309 |
| 4,976,843 | 12/1990 | Ward et al. | 250/492.3 |

Primary Examiner—Jack I. Berman
Assistant Examiner—Kiet T. Nguyen
Attorney, Agent, or Firm—Ladas & Parry

[57] ABSTRACT

An ion beam I is irradiated from an ion gun 10 onto a sample S on an XY stage 100, and an electron shower E is irradiated onto the sample S. Electrification of the sample by ion is neutralized by irradiation of the electron shower E. In the case of adjusting the electron shower E, a drive system 200 is driven by a control signal from a control unit 300 to scan a spot of the electron shower E by a Faraday cup F positioned at a corner of the XY stage 100. Detected current values of the Faraday cup F at respective scanning positions are amplified at an amplifier 210. The current values thus amplified are digitized at an A/D converter 220, and are then delivered to the control unit 300. The control unit 300 displays the intensity distribution of the electron shower E obtained by this scanning on a display unit 400.

5 Claims, 3 Drawing Sheets

FOCUSED ION BEAM IRRADIATING APPARATUS

BACKGROUND OF THE INVENTION

This invention relates to a focused ion beam irradiating apparatus, and more particularly to a technology for adjusting an electron shower in a focused ion beam system having a function to irradiate an electron shower for the purpose of preventing a sample surface from being charged.

As a system for carrying out correction of a pattern formed on a surface of a sample such as a photomask or reticle, etc., a focused ion beam irradiating apparatus is widely used. Generally, when an ion beam is irradiated onto such a sample, the sample surface is charged by positive charges of ion. However, when any charged or electrified state takes place on the sample surface, there would occur the drawback that the sample surface cannot be observed, etc. For this reason, a method of neutralizing positive charges of ion by electron is adopted. Namely, an electron gun for irradiating an electron shower for neutralization is prepared separately from an ion gun for irradiating an ion beam, thus to carry out irradiation of an electron shower together with irradiation of an ion beam.

However, in order to suitably carry out neutralization for positive charges of ion, it is required to adjust an irradiation current quantity, or an irradiation position range, etc. of an electron shower. As such an adjustment method, there is, e.g., disclosed in the Japanese Patent Laid Open Application No. 76662/89 publication, a method in which a conductive sample surface and a non conductive sample surface are prepared to adjust an electron shower so that both images obtained at the time of irradiation of an ion beam are equivalent to each other. With this method, however, there is the problem that since it is impossible to quantitatively recognize the irradiation state of an electron shower, sufficient adjustment cannot be carried out. As a method of obtaining quantitative information, there are carried out a method of irradiating an electron shower on a fluorescent sample to observe the state of the irradiated shower, and a method of irradiating an electron shower onto a substrate on which a resist is coated, etc. thereafter to develop this resist to observe that image. Even with these methods, however, there are the problems that correct information cannot be obtained, and that it takes much time for implementation thereof.

SUMMARY OF THE INVENTION

With the above in view, an object of this invention is to provide a focused ion beam irradiating apparatus having a function to easily carry out a precise adjustment of an electron shower.

To achieve the above described object, in accordance with this invention, there is provided a focused ion beam irradiating apparatus comprising:

an XY stage for mounting a sample on an XY plane surface;

a drive system for moving the XY stage along the XY plane surface;

an ion gun for irradiating an ion beam onto the sample on the XY stage;

an electron gun for irradiating an electron shower onto the sample in order to neutralize electrification by irradiation of the ion beam;

a current measurement element, which is provided at a portion on the XY stage, for measuring a current generated due to electron irradiation; and a control unit adapted for applying a predetermined control signal to the drive system to thereby move the current measurement element in X-axis and Y-axis directions in a region where the electron shower is irradiated, thus to detect measured current values by the current measurement element at respective positions.

In accordance with the system according to this invention, by scanning a spot region of the electron shower, which is formed on the sample surface, by using the current measurement element, it is possible to directly measure the irradiation elecron density distribution. In addition, since the current measurement element is provided on a portion of the XY stage, it is possible to carry out scanning of the current measurement element by making use of the drive system of the XY stage as it is. Since an irradiation electron density distribution measured in this way is displayed on a screen of a display unit, it is possible to easily grasp an intensity of the electron shower, a diameter of the spot, and a position of the spot. Thus, precise adjustment of an electron shower can be easily carried out.

DESCRIPTION OF THE PREFERRED EMBODIMENT

Figure 1:
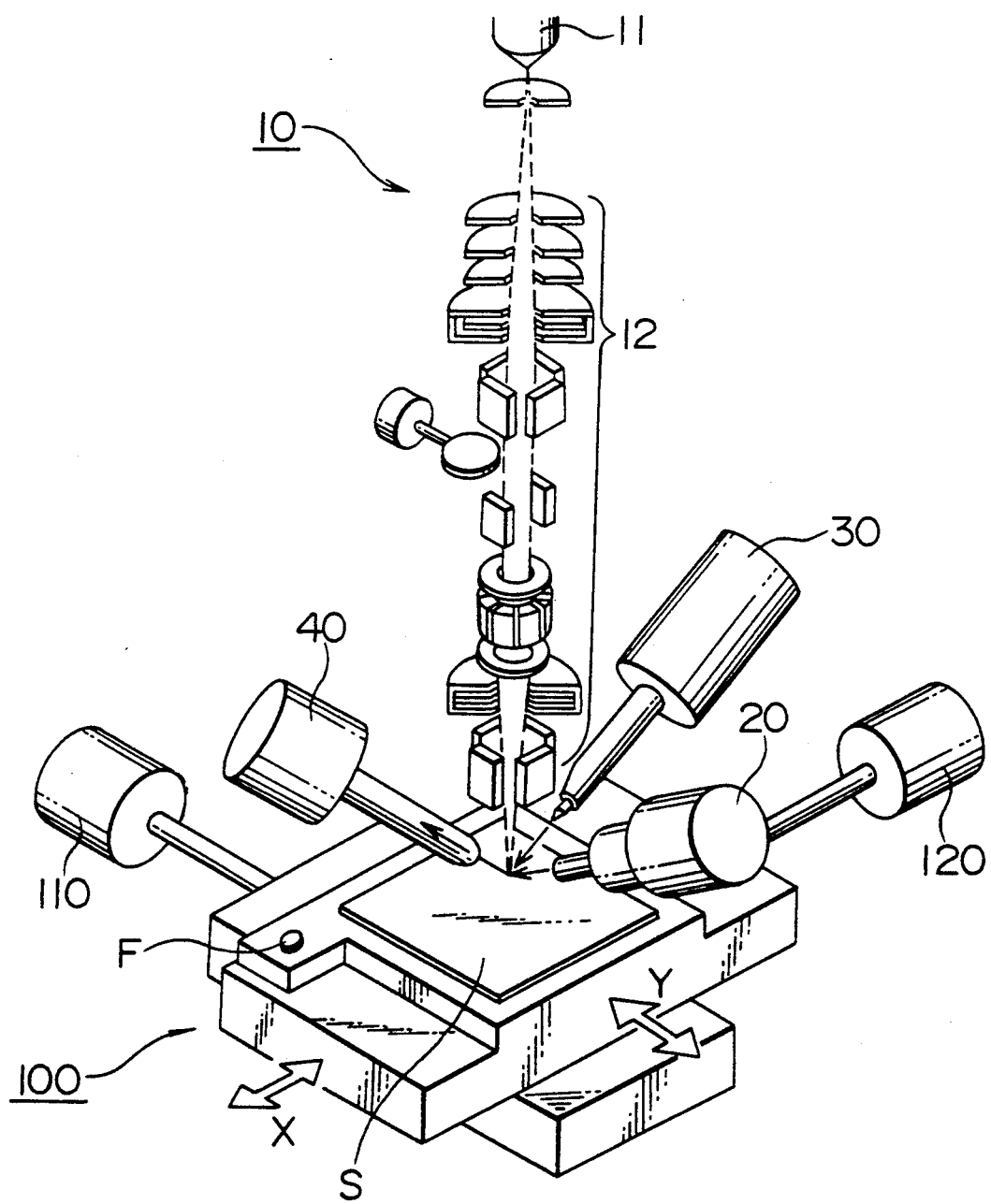
FIG. 1 is a perspective view showing the configuration of a beam irradiation portion of a focused ion beam irradiating apparatus according to an embodiment of this invention.

An embodiment of this invention will now be described with reference to the attached drawings. In FIG. 1, an ion gun 10 is comprised of an ion source 11 and an ion optical system 12. The ion optical system 12 is comprised of various electrodes and apertures, etc., and is adapted to irradiate, as a focused ion beam, ion generated in the ion source 11 onto a sample S. An electron gun 20 has a function to irradiate an electron shower onto the sample S. Namely, positive charges generated on the surface of the sample S by irradiation of an ion beam from the ion gun 10 is neutralized by an electron shower irradiated from the electron gun 20.

A gas injector 30 has a function to inject a predetermined gas (e.g., pyrene gas) onto the surface of the sample S. For example, molecules of this gas are caused to react with ion to form a film on the sample surface, thus making it possible to make a correction of a pattern on the sample. Further, a secondary charged particle detector 40 has a function to detect secondary charged particles from the surface of the sample S, thus making it possible to observe an image of a pattern on the sample.

The sample S is mounted on an XY stage 100. The XY stage 100 is driven in an X-axis direction of the figure by a stepping motor 120, and is driven in a Y-axis direction of the figure by a stepping motor 110. The feature of this invention resides in that a very small current measurement element is provided at a portion of the XY stage 100. In this embodiment, as the current measurement element, a Faraday cup F is used. This Faraday cup F is affixed at the place where there is no obstruction to mounting the sample S on the XY stage 100. Further, the measurement surface of the Faraday cup F is adjusted so that it is substantially flush with the surface of the sample S. Accordingly, by moving the XY stage 100, it is possible to move the Faraday cup F to the portion below the irradiation region of an electron shower irradiated from the electron gun 20.

The key teaching of this invention is that an approach is employed to measure the intensity distribution of an electron shower irradiated from the electron gun 20 by means of the Faraday cup F. The components for carrying out the intensity distribution measurement is shown in a block form in FIG. 2. Here, electron gun 20, ion gun 10, XY stage 100, Faraday cup F, and sample S are components respectively corresponding to those explained in the perspective view shown in FIG. 1, and a drive system 200 is an element corresponding to stepping motors 110 and 120. In addition, there are prepared components of an amplifier 210 for amplifying a very small current measured by the Faraday cup F, an analog/digital converter 220 for converting a signal amplified at the amplifier 210 to a digital signal, a control unit 300 for carrying out control for the drive system 200, and processing a digital signal delivered from the A/D converter 220, and a display unit 400 for carrying out display of a measured result. The control unit is comprised of a personal computer in concrete terms. It is to be noted that since the gas injector 30 and the secondary charged particle detector 40 shown in FIG. 1 are not essential components of this invention, indication thereof is omitted in FIG. 2.

Figure 2:
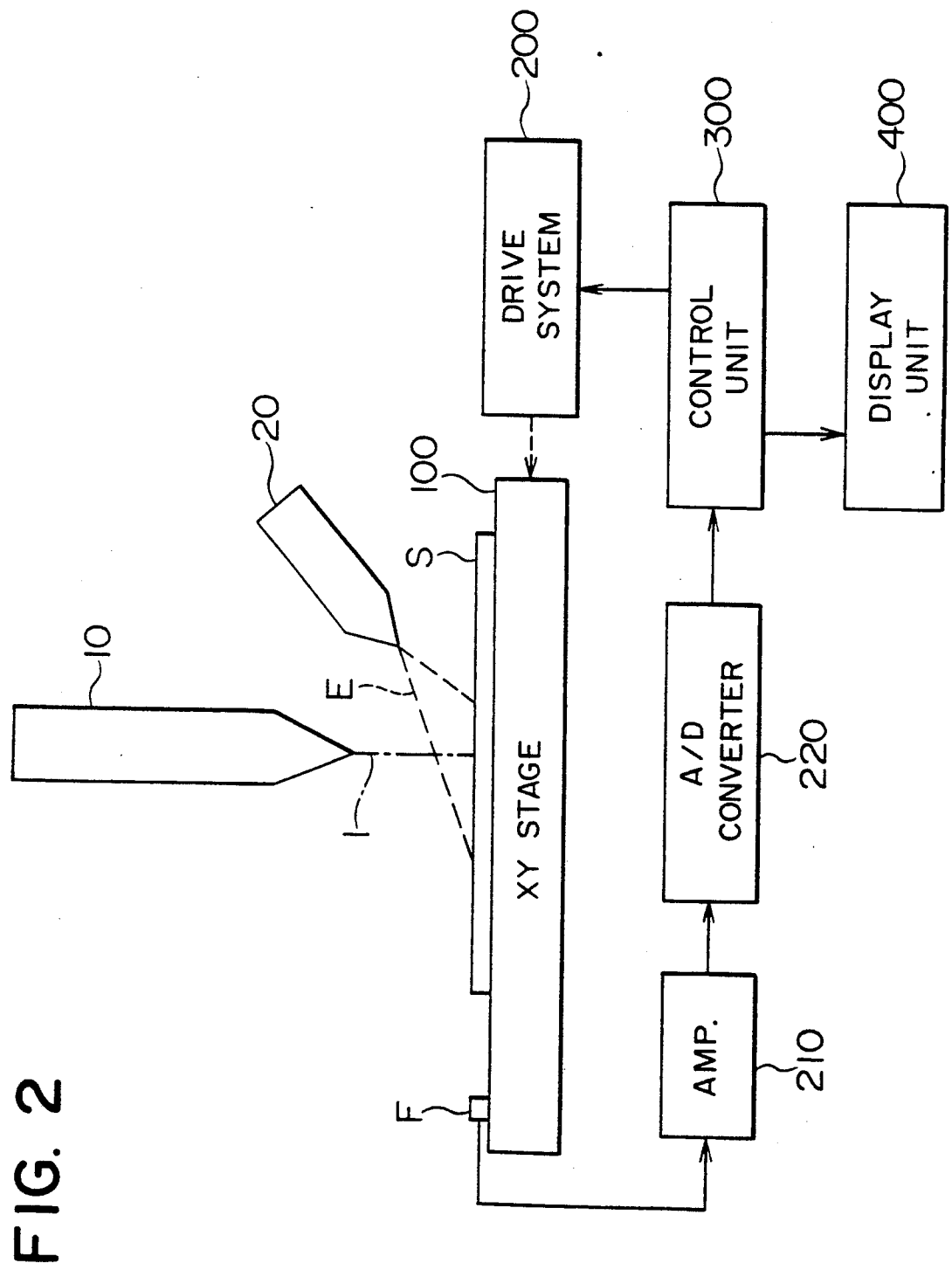
FIG. 2 is a block diagram showing the configuration of an electron shower measurement portion of the focused ion beam irradiating apparatus in the embodiment of this invention.

In the system shown in FIG. 2, an ion beam I from the ion gun 10 is irradiated onto the surface of the sample S. At this time, in order to neutralize electrification of the sample S, an electron shower E is irradiated from the electron gun 20. It is to be noted that it is required for carrying out a suitable neutralization to adjust the intensity, beam diameter and irradiation position of the electron shower E. In this apparatus, since the electron density distribution of the electron shower E is displayed on the display unit 400 in a manner described below, it is possible to precisely and easily carry out such an adjustment. First, the control unit 300 delivers, to the drive system 200, such a control signal to move the XY stage 100. By this movement, the Faraday cup F is caused to fall within the irradiation region of the electron shower E. Then, the Faraday cup F is moved by dx in an X-axis direction and dy in a Y-axis direction, thus to scan the irradiation region of the electron shower E by the Faraday cup F. Generally, the diameter of the Faraday cup F is approximately 100 μm, and it is therefore preferable that the magnitudes of dx and dy are set to values of the same order as above. If an electron shower E is irradiated from the electron gun 20 during scanning of the Faraday cup F, a very small current will flow in the Faraday cup F due to the electron shower E. Very small currents detected by the Faraday cup F at respective scanning positions are amplified at the amplifier 210. The current values thus amplified are digitized at the A/D converter 220, and are then inputted to the control unit 300. Accordingly, the control unit 300 can obtain information indicating current values detected at respective positions. In other words, the electron density distribution of a spot formed on the surface of the sample S by the electron shower E can be provided. Thus, the control unit 300 displays this electron density distribution on the screen of the display unit 400.

Figure 3:
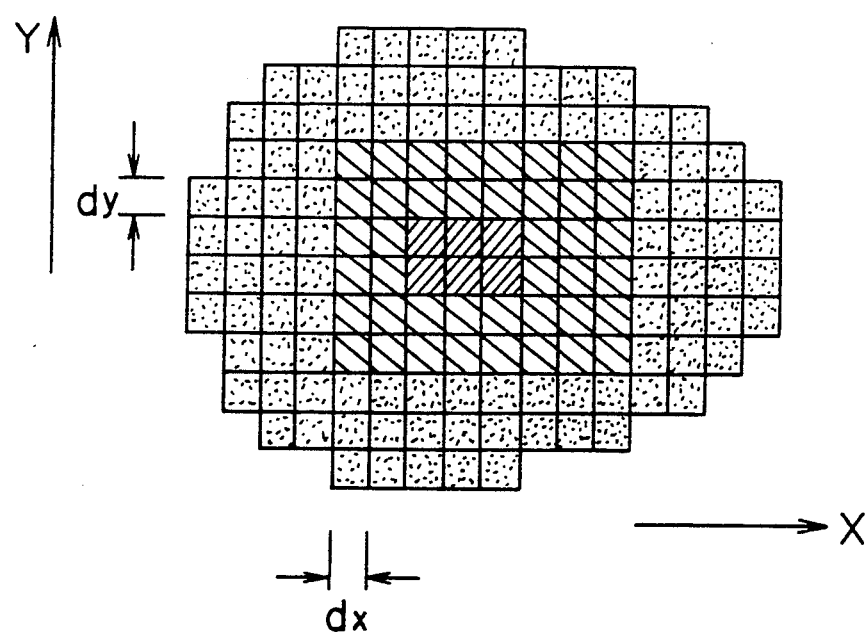
FIG. 3 is a view showing an example of an electron density distribution displayed on the screen of a display unit in the apparatus shown in FIG. 2.

FIG. 3 is a view showing an example of the electron density distribution displayed in this way. In this display, pixels are arranged at pitches dx and dy in X-axis and Y-axis directions corresponding to the drive directions of the XY stage, respectively. Respective pixels are displayed at densities corresponding to very small current values detected by the Faraday cup F at corresponding positions. Alternatively, a scheme may be employed to vary colors of pixels in correspondence with respective very small current values. An operator looks at this display, thus making it possible to recognize the positionally dependent intensity of an electron shower, i.e., the irradiation distribution thereof, and to further recognize the magnitude of the diameter or the formation position of a spot formed on the surface of the sample S. Accordingly, looking at this display, an operator can precisely carry out adjustment of the intensity, the beam diameter, and the irradiation position of an electron shower. In addition, since an adjusted distribution can be provided only by carrying out scanning by the Faraday cup F for a second time, operation is also very simple. It is to be noted that the electron density distribution of an electron shower is not necessarily required to be displayed on the display unit 400, but may be outputted, e.g., to a printer.

While this invention has been described in connection with the embodiment shown, this invention is not limited to this embodiment, but may be carried out in various forms. For example, in order to carry out scanning of the Faraday cup F with a higher accuracy, positional control using a laser interferometer, etc. may be carried out.

As stated above, in accordance with the focused ion beam irradiating apparatus according to this invention, an approach is employed to scan the spot region of an electron shower formed on a sample surface by using a current measurement element to thereby directly measure an irradiation electron density distribution. Accordingly, it is possible to easily grasp or recognize the intensity of the electron shower, the diameter of spot, and the position of spot. Thus, precise adjustment of the electron shower can be carried out with ease.

What is claimed is:

1. A focused ion beam irradiating apparatus comprising:

an XY stage for mounting a sample on an XY plane surface;

a drive system for moving said XY stage along said XY plane surface;

an ion gun for irradiating an ion beam onto said sample on said XY stage;

an electron gun for irradiating an electron shower onto said sample in order to neutralize electrification by irradiation of the ion beam;

a current measurement element for measuring a current generated due to electron irradiation, said element being provided at a portion on said XY stage; and a control unit adapted for applying a predetermined control signal to said drive system to thereby move said current measurement element in X-axis and Y-axis directions in a region where the electron shower is irradiated, thus to detect measured current values by said current measurement element at respective positions.

2. A focused ion beam irradiating apparatus as set forth in claim 1, further comprising a display unit for displaying a distribution of measurement current values detected by said control unit on a screen thereof.

3. A focused ion beam irradiating apparatus as set forth in claim 1, wherein a Faraday cup is used as the current measurement element.

4. A focused ion beam irradiating apparatus as set forth in claim 3, wherein the XY stage is driven at a pitch corresponding to a diameter of the Faraday cup at a time of measurement.

5. A focused ion beam irradiating apparatus as set forth in claim 3, having a structure permitting a measurement surface of the Faraday cup to be adjusted to a height flush with an upper surface of a sample mounted on the XY stage.

* * * * *